US010381561B2

(12) United States Patent
Ando et al.

(10) Patent No.: US 10,381,561 B2
(45) Date of Patent: Aug. 13, 2019

(54) DEDICATED CONTACTS FOR CONTROLLED ELECTROFORMING OF MEMORY CELLS IN RESISTIVE RANDOM-ACCESS MEMORY ARRAY

(71) Applicant: International Business Machines Corporation, Armonk, NY (US)

(72) Inventors: Takashi Ando, Tuckahoe, NY (US); Lawrence A. Clevenger, Saratoga Springs, NY (US); Chih-Chao Yang, Glenmont, NY (US); Benjamin D. Briggs, Waterford, NY (US)

(73) Assignee: Internatoinal Business Machines Corporation, Armonk, NY (US)

( * ) Notice: Subject to any disclaimer, the term of this patent is extended or adjusted under 35 U.S.C. 154(b) by 0 days.

(21) Appl. No.: 15/867,044

(22) Filed: Jan. 10, 2018

(65) Prior Publication Data

US 2019/0214558 A1    Jul. 11, 2019

(51) Int. Cl.
*H01L 45/00*    (2006.01)
*G11C 13/00*    (2006.01)
*H01L 27/24*    (2006.01)

(52) U.S. Cl.
CPC ...... *H01L 45/1273* (2013.01); *G11C 13/0007* (2013.01); *H01L 27/2463* (2013.01);
(Continued)

(58) Field of Classification Search
CPC ............. H01L 27/2463; H01L 45/1233; H01L 45/124; H01L 45/126; H01L 45/1273;
(Continued)

(56) References Cited

U.S. PATENT DOCUMENTS 8,106,377 B2    1/2012 Noshiro
8,742,390 B1*   6/2014 Tu ........................... H01L 45/04
                                                              257/4
(Continued)

FOREIGN PATENT DOCUMENTS

WO    2009134677 A2    11/2009

OTHER PUBLICATIONS

A. Shkabko et al., "Resistance Switching at the Al/SrTiO3-xNy Anode Interface," Applied Physics Letters, 212102, Apr. 2009, 3 pages, vol. 94, No. 21.

*Primary Examiner* — Stephen W Smoot
(74) *Attorney, Agent, or Firm* — Vazken Alexanian; Ryan, Mason & Lewis, LLP

(57) ABSTRACT

Methods and devices are provided for fabricating a resistive random-access array having dedicated electroforming contacts. A lower conductive line is formed on an interlayer dielectric layer. A lower electrode is formed on the lower conductive line. An isolation layer is formed having an upper surface which is coplanar with an upper surface of the lower electrode. A stack structure including a metal-oxide layer and upper electrode is formed on the lower electrode. Insulating spacers are formed on sidewalls of the stack structure. The lower electrode, and stack structure form a resistive memory cell, wherein a footprint of the lower electrode is greater than that of the upper electrode. An upper conductive line contacts the upper electrode, and is arranged orthogonal to the lower conductive line. A dedicated electroforming contact contacts an extended portion of the lower electrode which extends past a cross-point of the upper and lower conductive lines.

14 Claims, 9 Drawing Sheets

(52) U.S. Cl.
CPC ............ *H01L 45/10* (2013.01); *H01L 45/124* (2013.01); *H01L 45/1233* (2013.01); *H01L 45/146* (2013.01); *H01L 45/1608* (2013.01); *H01L 45/1675* (2013.01); *G11C 13/0069* (2013.01); *G11C 13/0097* (2013.01); *G11C 2213/15* (2013.01); *G11C 2213/32* (2013.01); *G11C 2213/52* (2013.01)

(58) Field of Classification Search
CPC . H01L 45/145; H01L 45/146; H01L 45/1608; H01L 45/1666; H01L 45/1675; G11C 13/0007; G11C 2213/15; G11C 2213/32; G11C 2213/52
See application file for complete search history.

(56) References Cited

U.S. PATENT DOCUMENTS

| | | | |
|---|---|---|---|
| 9,159,415 B2 | 10/2015 | Cosemans | |
| 9,331,277 B2* | 5/2016 | Chen | ................ H01L 45/16 |
| 9,502,471 B1 | 11/2016 | Lu et al. | |
| 9,543,511 B2* | 1/2017 | Sung | ................ H01L 45/1233 |
| 9,583,539 B2 | 2/2017 | Takaki | |
| 9,601,545 B1* | 3/2017 | Tu | ................ H01L 27/0805 |
| 2010/0090192 A1* | 4/2010 | Goux | ................ B82Y 10/00 |
| | | | 257/4 |
| 2010/0232204 A1* | 9/2010 | Muraoka | ............ G11C 13/0007 |
| | | | 365/148 |
| 2011/0220862 A1* | 9/2011 | Arita | ................ H01L 27/2409 |
| | | | 257/4 |
| 2015/0053908 A1 | 2/2015 | Fowler | |
| 2016/0218283 A1* | 7/2016 | Trinh | ................ H01L 45/08 |
| 2017/0053968 A1 | 2/2017 | Sheng et al. | |
| 2017/0249990 A1 | 8/2017 | Bauer et al. | |

* cited by examiner

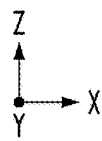
*FIG. 4*
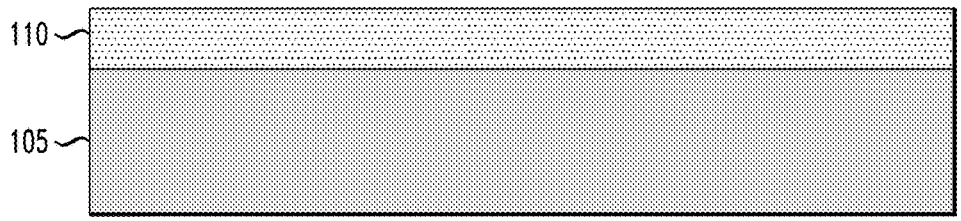
*FIG. 5*
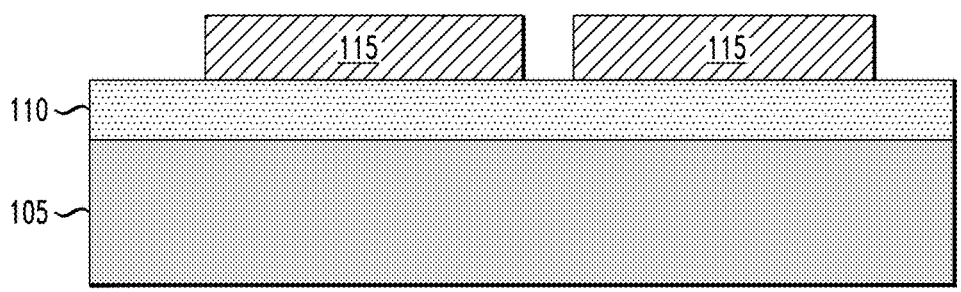
*FIG. 6*
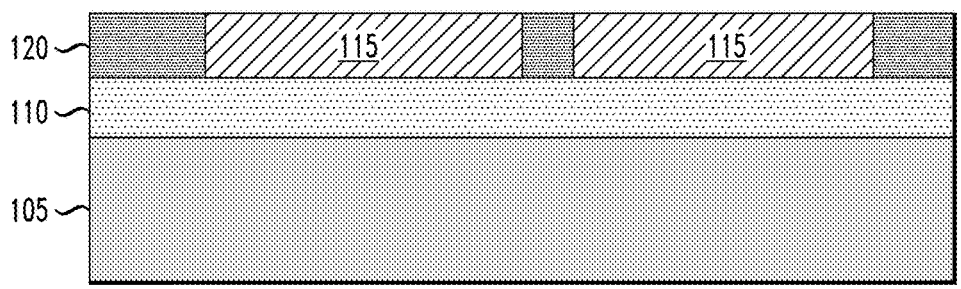

DEDICATED CONTACTS FOR CONTROLLED ELECTROFORMING OF MEMORY CELLS IN RESISTIVE RANDOM-ACCESS MEMORY ARRAY

TECHNICAL FIELD

This disclosure generally relates to semiconductor fabrication techniques and, in particular, resistive random-access memory arrays, and methods for fabricating resistive random-access memory arrays.

BACKGROUND

A resistive random-access memory (RRAM) is one type of non-volatile memory device which comprises a plurality of memory cells that maintain stored data when power is not supplied. One conventional structure of an RRAM memory cell comprises a metal-insulator-metal (MIM) structure in which the insulator layer (e.g., metal-oxide) exhibits a resistive switching behavior. For example, a RRAM memory cell may exhibit bi-polar switching properties to switch between a high conductivity state (or low resistance state (LRS)) when a first voltage is applied to the memory cell, and a low conductivity state (or high resistance state (HRS)) when a second voltage is applied to the memory cell. In this regard, the two states, LRS and HRS, of the RRAM memory cells are reversible based on the voltage applied thereto.

With resistive memory cells, such as RRAM cells, an "electroforming" process is performed to form a conductive filament in the metal-oxide layer, which serves as a switching element for the memory cell. The electroforming process is performed on newly manufactured memory cells to initialize the resistive switching properties of the memory cells. In general, an electroforming process for a given resistive memory cell comprises applying a voltage pulse to the memory cell at a given voltage level and for a given duration to form a conductive filament in the memory cell. The electroforming process will vary depending on the structural configuration and resistive materials of the resistive memory cells.

RRAM devices typically have low switching resistance (~kOhm) which results from the formation of a relatively strong conductive filament during the electroforming process. For some applications, however, low switching resistance is not desirable. Therefore, certain techniques can be utilized to control the current that is applied to the memory cells during an electroforming process. For example, in some conventional RRAM frameworks, each RRAM cell comprises a current limiting FET device integrated with the memory cells to limit the amount of current that is applied to the RRAM cells, which poses a significant penalty on the foot print of the memory array.

SUMMARY

Embodiments of the invention include methods for fabricating a RRAM array having dedicated electroforming contacts to enable controlled electroforming of resistive memory cells within the RRAM array, as well as RRAM crossbar array structures comprising dedicated electroforming contacts for enabling controlled electroforming of resistive memory cells.

For example, one embodiment includes a method for fabricating a memory device. The method comprises: forming a lower conductive line on an interlayer dielectric layer; forming a lower electrode on the lower conductive line; forming an isolation layer to isolate the lower electrode, wherein an upper surface of the isolation layer is coplanar with an upper surface of the lower electrode; forming a stack structure on the lower electrode, wherein the stack structure comprises a metal-oxide layer disposed on the lower electrode, and an upper electrode disposed on the metal-oxide layer; forming insulating spacers on sidewalls of the stack structure; wherein the lower electrode, the metal-oxide layer, and the upper electrode comprise a resistive memory cell, and wherein the lower electrode has a footprint which is greater than a footprint of the upper electrode; forming an upper conductive line in contact with the upper electrode, wherein the upper conductive line is arranged orthogonal to the lower conductive line; and forming a dedicated electroforming contact in contact with an extended portion of the lower electrode which extends past a cross-point of the upper and lower conductive lines.

Another embodiment includes a memory device. The memory device comprises: a lower conductive line disposed on an interlayer dielectric layer; a lower electrode disposed on the lower conductive line; an isolation layer to isolate the lower electrode, wherein an upper surface of the isolation layer is coplanar with an upper surface of the lower electrode; a stack structure disposed on the lower electrode, wherein the stack structure comprises a metal-oxide layer disposed on the lower electrode, and an upper electrode disposed on the metal-oxide layer; insulating spacers disposed on sidewalls of the stack structure; wherein the lower electrode, the metal-oxide layer, and the upper electrode comprise a resistive memory cell, and wherein the lower electrode has a footprint which is greater than a footprint of the upper electrode; an upper conductive line in contact with the upper electrode, wherein the upper conductive line is arranged orthogonal to the lower conductive line; and a dedicated electroforming contact in contact with an extended portion of the lower electrode which extends past a cross-point of the upper and lower conductive lines.

In another embodiment, the memory device comprises electroforming circuitry connected to the dedicated electroforming contact to enable electroforming of the resistive memory cell by applying electroforming signals to the resistive memory cell through the dedicated electroforming contact.

In one embodiment, the memory device comprises a RRAM crossbar array, wherein the RRAM crossbar array comprises a two-dimensional memory array comprising at least 100×100 resistive memory cells.

Other embodiments will be described in the following detailed description of embodiments, which is to be read in conjunction with the accompanying figures.

BRIEF DESCRIPTION OF THE DRAWINGS

FIGS. 4~12B schematically illustrate an exemplary process flow for fabricating a semiconductor memory device comprising an array of resistive memory cells according to an embodiment of the invention, wherein:

FIG. 4 is a schematic cross-sectional side view of the semiconductor device at an intermediate stage of fabrication in which lower conductive lines are formed on a substrate;

FIG. 5 is a schematic cross-sectional side view of the semiconductor device shown in FIG. 4 after forming a plurality of lower electrodes of resistive memory cells on the lower conductive lines;

FIG. 6 is a schematic cross-sectional side view of the semiconductor device shown in FIG. 5 after forming an isolation layer to electrically insulate the lower electrodes;

FIG. 7 is a schematic cross-sectional side view of the semiconductor device shown in FIG. 6 after forming stacks of metal-oxide layers and upper electrodes of resistive memory cells;

FIG. 8 is a schematic cross-sectional side view of the semiconductor device shown in FIG. 7 after forming insulating spacers on sidewalls of the stacks of metal-oxide and upper electrode layers of the resistive memory cells;

FIG. 9 is a schematic cross-sectional side view of the semiconductor device shown in FIG. 8 after forming a first interlayer-dielectric (ILD) layer to encapsulate the resistive memory cells in dielectric material;

FIG. 10 is a schematic cross-sectional side view of the semiconductor device shown in FIG. 9 after performing a metallization process to form upper conductive lines in contact with the upper electrodes of the resistive memory cells;

FIG. 11 is a schematic cross-sectional side view of the semiconductor device shown in FIG. 10 after forming a second ILD layer to cover the upper conductive lines; and FIGS. 12A and 12B are schematic views of the semiconductor device shown in FIG. 11 after forming dedicated electroforming contacts in the first and second ILD layers in contact with extended portions of the lower electrodes of the resistive memory cells.

FIGS. 13 and 14 schematically illustrate an exemplary process flow for fabricating an array of resistive memory cells according to another embodiment of the invention, wherein:

FIG. 13 is a schematic cross-sectional side view of the semiconductor device shown in FIG. 4 after forming an isolation layer on the lower conductive lines; and FIG. 14 is a schematic cross-sectional side view of the semiconductor device shown in FIG. 13 after patterning the isolation layer to form openings that expose portions of the lower conductive lines, wherein the openings are filled with conductive material to form lower electrodes of resistive memory cells.

FIGS. 15 and 16 schematically illustrate an exemplary process flow for fabricating an array of resistive memory cells according to another embodiment of the invention, wherein:

FIG. 15 is a schematic cross-sectional side view of the semiconductor device shown in FIG. 8 after forming an ILD layer over the surface of the semiconductor structure to cover the resistive memory cells; and FIG. 16 is a schematic cross-sectional side view of the semiconductor device shown in FIG. 15 after forming upper conductive lines and dedicated electroforming contacts in the ILD layer.

DETAILED DESCRIPTION OF EMBODIMENTS

Figure 1:
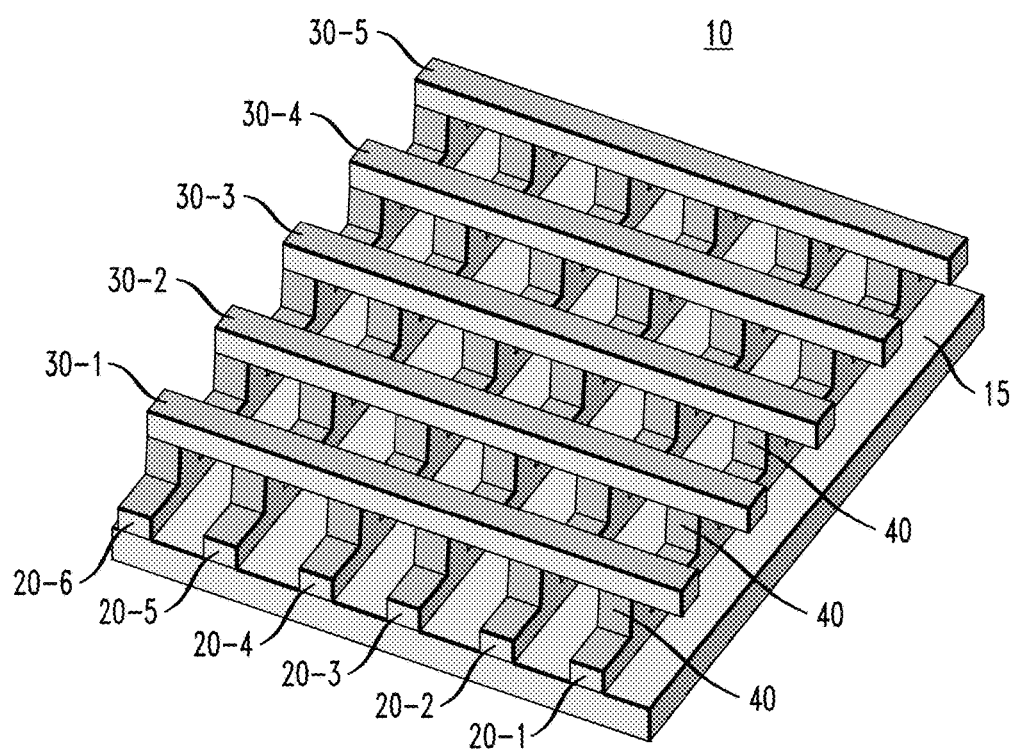
FIG. 1 is a perspective schematic view of a RRAM crossbar array structure which can be fabricated to include dedicated electroforming contacts to resistive memory cells for controlled electroforming, according to embodiments of the invention.

Embodiments of the invention will now be discussed in further detail with regard to methods for fabricating RRAM array devices having dedicated electroforming contacts to enable controlled electroforming of resistive memory cells within the RRAM array, as well as RRAM crossbar array structures comprising dedicated electroforming contacts for enabling controlled electroforming of resistive memory cells.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount. Further, the terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or Y-direction of the Cartesian coordinates shown in the drawings.

FIG. 1 is a perspective schematic view of a RRAM crossbar array structure 10 which can be fabricated to include dedicated electroforming contacts to resistive memory cells for controlled electroforming according to embodiments of the invention. The RRAM crossbar array structure 10 comprises an ILD layer 15, a plurality of lower conductive lines 20-1, 20-2, 20-3, 20-4, 20-5, and 20-6 (collectively, lower conductive lines 20) formed on the ILD layer 15, a plurality of upper conductive lines 30-1, 30-2, 30-3, 30-4, and 30-5 (collectively, upper conductive lines 30), and resistive memory cells 40 disposed between crosspoints (or intersections) of the lower and upper conductive lines 20 and 30. In one embodiment, the lower conductive lines 20 comprise word lines that are arranged in parallel to each other, and the upper conductive lines 30 comprise data/sense lines or bit lines that are arranged parallel to each other, wherein the lower conductive lines 20 and the upper conductive lines 30 are arranged orthogonal to each other. Each resistive memory cell 40 can include a storage element (e.g., a resistive memory element) coupled (e.g., in series) to a selector device (e.g., an access device). The access device can be, for example, a diode or a transistor (e.g., a field effect transistor (FET)), or other types of access devices which are commonly used in RRAM arrays.

During operation, the resistive memory cells 40 of the RRAM array 10 can be programmed into one of two resistive states, e.g., LRS and HRS, by applying suitable programming signals to the restive memory cells via the lower and upper conductive lines 20 and 30. A data access (or sensing) operation is used to determine the data state of a target resistive memory cell 40 by sensing a current on a given upper conductive line 30 (e.g., bit line) connected to the target resistive memory cell 40 in response to a read voltage applied to a selected lower conductive line 20 (e.g., word line) to which the target resistive memory cell 40 is connected.

Figure 2:
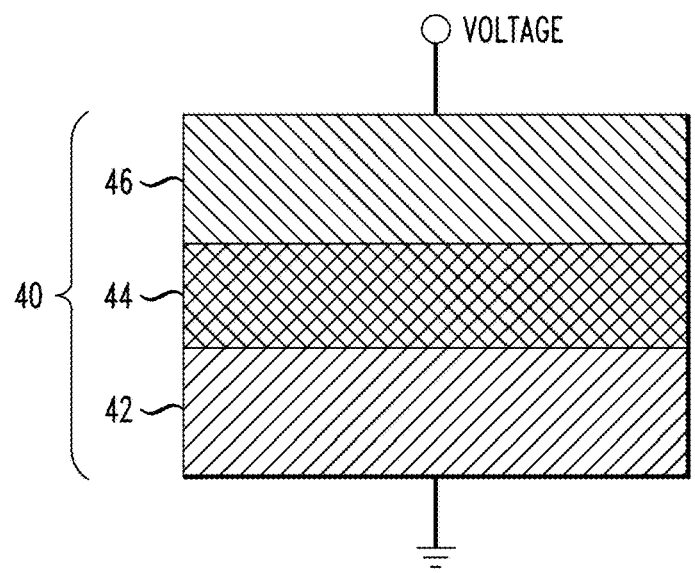
FIG. 2 schematically illustrates a structure of a resistive memory cell which can be implemented in the RRAM crossbar array structure of FIG. 1.

FIG. 2 schematically illustrates a structure of a resistive memory cell 40 which can be implemented in the RRAM crossbar array structure 10 of FIG. 1. The resistive memory cell 40 comprises a lower electrode 42, metal-oxide layer 44 (insulating layer), and an upper electrode 46. In one embodiment, the metal-oxide layer 44 is formed of a transition metal oxide material which serves as a programmable element that has different resistance states (or different data states). Depending on the structural configuration, the resistive memory cell 40 can be a single level and/or a multilevel RRAM memory cell. In conventional designs, a lower conductive line 20 in FIG. 1 serves as the lower electrode 42 and an upper conductive line 30 serves as the upper electrode of the resistive memory cell 40.

Figure 3:
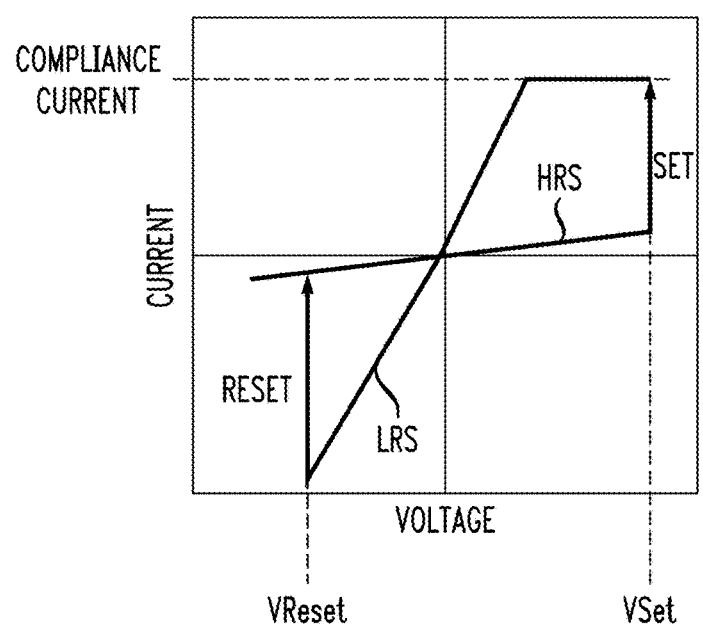
FIG. 3 graphically illustrates switching characteristics of a resistive memory cell.

FIG. 3 graphically illustrates switching characteristics of a resistive memory cell. In particular, FIG. 3 graphically illustrates a current/voltage relationship for a bi-polar resistive memory cell (such as shown in FIG. 2) having an insulating layer (e.g., metal-oxide layer 44) which exhibits a switching behavior between a HRS and a LRS after an electroforming operation. The switching between the HRS and LRS is controlled by a RESET voltage ($V_{Reset}$) and a SET voltage ($V_{Set}$), respectively.

As graphically illustrated in FIG. 3, the resistive memory cell 40 is "SET" by applying a $V_{Set}$ voltage to the resistive memory cell 40 which is sufficient to reconnect a conductive filament in the metal-oxide layer 44 between the electrodes 42 and 46, and switch the resistive memory cell 40 into the LRS (or high conduction state). On the other hand, the resistive memory cell 40 is "RESET" by applying a $V_{Reset}$ voltage to the resistive memory cell 40 which is sufficient to disconnect the conductive filament in the metal-oxide layer 44 between the electrodes 42 and 46, and switch the resistive memory cell 40 into the HRS (or low conduction state). The "compliance current" represents a maximum level of current that can flow through the resistive memory cell, which is limited by a current limiting device.

RRAM is considered as a promising technology for electronic synapse devices or memristor for neuromorphic computing as well as high-density and high-speed non-volatile memory application. In neuromorphic computing applications, a resistive memory device can be used as a connection (synapse) between a pre-neuron and post-neuron, representing the connection weight in the form of device resistance. Multiple pre-neurons and post-neurons can be connected through a crossbar array of RRAMs, which naturally expresses a fully-connected neural network. In order to fabricate a large-scale RRAM crossbar array for such applications, each cross-point between the upper and lower conductive lines should have a high resistance (or low leakage current), otherwise the voltage drop across the upper conductive lines and across the lower conductive lines becomes significant.

As noted above, RRAM devices typically have low switching resistance (on the order of ~kOhm) unless current levels are controlled with external current limiting devices such as FETs during electroforming process to minimize the size/strength of the conductive filaments that are formed in the resistive metal-oxide layers of the memory cells. A relatively low device resistance of a RRAM cell (e.g., on order of ~kOhm) limits the size of RRAM crossbar array structure, as a larger memory array requires relatively long upper and lower crossbar wiring, and the kOhm switching resistance can result in significant voltage drops across long crossbar wiring. In this regard, a higher RRAM memory cell resistance (or switching resistance) on the order of MOhms is desirable for a RRAM crossbar array of size 100×100 or greater. Conventional methods for limiting the current during the electroforming process utilize a FET device that is integrated within each RRAM memory cell, which poses a significant penalty on device foot print.

Embodiments of the invention address these issues by providing methods for fabricating RRAM array devices having dedicated electroforming contacts to enable controlled electroforming of resistive memory cells within the RRAM array, as well as RRAM crossbar array structures comprising dedicated electroforming contacts to enable controlled electroforming of resistive memory cells. The dedicated electroforming contacts are utilized during an electroforming process to apply the necessary voltage signals to the resistive memory cells, while limiting the amount of current applied to the resistive memory cells during the electroforming process to thereby limit the size/strength of the conductive filaments that are formed in the RRAM memory cells to achieve high switching resistance (~MOhm) RRAM memory cells, which is sufficient for use in large RRAM crossbar memory arrays.

Various methods for fabricating an array of resistive memory cells in a RRAM crossbar array structure will now be described in further detail with reference o FIGS. 4~16. For example, FIGS. 4~12B schematically illustrate an exemplary process flow for fabricating an array of resistive memory cells according to an embodiment of the invention. FIG. 4 is a schematic cross-sectional side view of a semiconductor device 100 at an intermediate stage of fabrication in which an array of lower conductive lines of an RRAM crossbar array structure is formed on a substrate 105. For ease of illustration, FIG. 4 shows one lower conductive line 110 of an RRAM crossbar array structure that is formed on the substrate 105. The lower conductive line 110 can be formed by depositing and patterning a layer of metallic material using known deposition and patterning methods. The lower conductive line 110 is preferably formed of a metallic material with low-resistivity to minimize voltage drop across along relatively long conductive lines of a large RRAM crossbar array structure (e.g., 100×100 resistive memory cell array). For example, the lower conductive lines can be formed of a metallic material such as copper (Cu), tungsten (W), aluminum, (Al), or other suitable low-resistivity metals or conductive materials. It is to be noted that in each drawing, the X-Y plane represents a plane that is parallel to the plane of the substrate 105, and the lower conductive lines 110 of the RRAM crossbar array structure are arranged in parallel on the surface of the substrate 105 and laterally extend in the X-direction.

While the substrate 105 is generically depicted in FIG. 1, in one embodiment, the substrate 105 would comprise various layers including, for example, a base semiconductor substrate (e.g., semiconductor wafer), a front-end-of-line (FEOL) layer formed on the base semiconductor substrate, a middle-of-line (MOL) structure, and one or more initial layers of a back-end-of-line (BEOL) structure. For example, in one embodiment, base semiconductor substrate may be a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V). Non-limiting examples of compound semiconductor materials include gallium arsenide, indium arsenide, and indium phosphide.

In another embodiment, the base semiconductor substrate may be a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of the FEOL layer. In the example embodiment, the FEOL layer would comprise the active circuitry (e.g., word line select circuitry, data/bit line sensing circuitry, electroforming circuitry, etc.) to control operation of the RRAM crossbar array, and to control electroforming of the resistive memory cells of the RRAM crossbar array.

The MOL layer would comprise one or more PMD (pre-metal dielectric) layers and conductive contacts (e.g., via contacts) that are formed in the PMD layer. The PMD layer is formed over the components and devices of the FEOL layer. A pattern of openings is formed in the PMD layer, and the openings are filled with a conductive material, such as tungsten, to form conductive via contacts that are in electrical contact with device terminals of the integrated circuitry of the FEOL layer. The conductive via contacts of the MOL layer provide electrical connections between the integrated circuitry of the FEOL layer and a first level of metallization of the BEOL structure.

As is known in the art, a BEOL structure comprises multiple levels of dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O (input/output) connections to external components.

In one embodiment, a RRAM crossbar array structure is integrally formed in the BEOL layer using a BEOL fabrication process flow which includes the methods schematically shown in FIGS. 4-16. In this regard, the array of lower conductive lines (e.g., lower conductive line 110, FIG. 4) would be formed on an ILD layer of the BEOL structure. The RRAM crossbar array structure would be connected to devices in the FEOL layer using a network of electrical connections formed in the BEOL and MOL layers.

Next, FIG. 5 is a schematic cross-sectional side view of the semiconductor device shown in FIG. 4 after forming a plurality of lower electrodes of resistive memory cells on the lower conductive lines. For ease of illustration, FIG. 5 schematically illustrates first and second lower electrodes 115 which correspond to first and second resistive memory cells to be formed adjacent to each other on the lower conductive line 110. The lower electrodes 115 are formed of a conductive material such as titanium nitride (TiN) or other types of conducting material which are suitable for the given application. In one embodiment, the lower electrodes 115 are formed by depositing a layer of conductive material (e.g., TiN) over the surface of the substrate to cover the lower conductive lines, followed by a lithographic patterning process to pattern the layer of conductive material to form the lower electrodes 115. The layer of conductive material can be patterned by forming a photoresist mask having openings that define regions of the layer of conductive material to be etched away using a dry etch process (e.g., reactive ion etch (ME) process) having an etch chemistry that is configured to etch the layer of conductive material selective to the material of the lower conductive line 110.

Next, FIG. 6 is a schematic cross-sectional side view of the semiconductor device shown in FIG. 5 after forming an isolation layer 120 to electrically insulate the lower electrodes 115. In one embodiment, the isolation layer 120 comprises an insulating material such as silicon nitride (SiN), silicon based low-k dielectrics, ULK (ultra-low-k) dielectric materials, or other types of insulating materials which are suitable for the given application. In one embodiment, the isolation layer 120 is formed by depositing a layer of insulating material using known methods such as ALD (atomic layer deposition), CVD (chemical vapor deposition) PECVD (plasma-enhanced CVD), or PVD (physical vapor deposition), followed by a planarization process (e.g., chemical-mechanical polishing (CMP)) to planarize the layer of insulating material down to the upper surfaces of the lower electrodes 115, resulting in the structure shown in FIG. 6.

Figure 7:
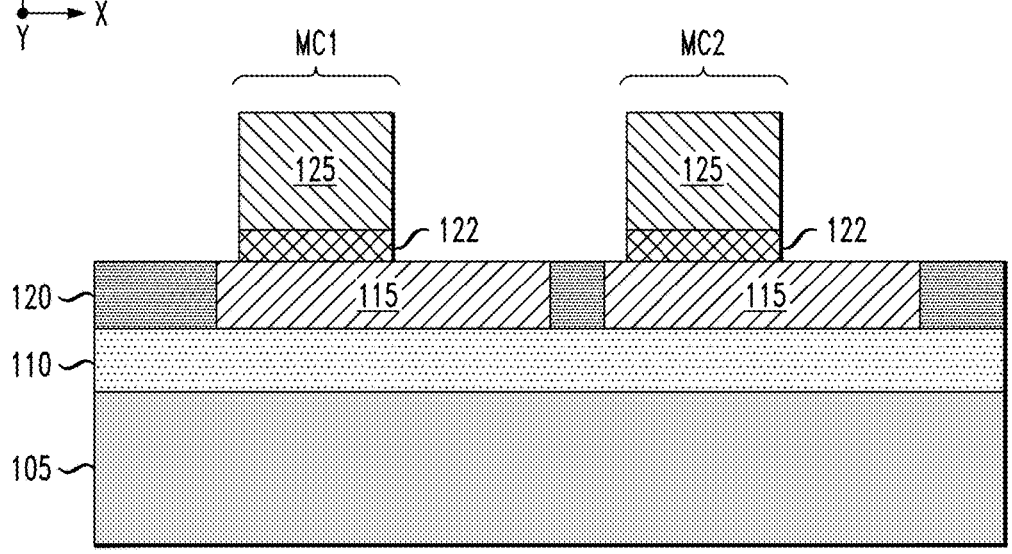

FIG. 7 is a schematic cross-sectional side view of the semiconductor device shown in FIG. 6 after forming stacks of metal-oxide layers 122 and upper electrodes 125 of resistive memory cells MC1 and MC2. The metal-oxide layers 122 and the upper electrodes 125 are formed by depositing a layer of metal-oxide material over the planarized surface of the structure shown in FIG. 6 and depositing a layer of conductive material over the layer of metal-oxide material, and then patterning the layers to form separate stacks of the metal-oxide layer 122 and the upper electrode 125 for the resistive memory cells MC1 and MC2. The metal-oxide layers 122 can be formed of any type of metal-oxide material which is suitable for the given application including, but not limited to, hafnium oxide, tantalum oxide, nickel oxide, titanium oxide, zirconium oxide, zinc oxide, tungsten oxide, aluminum oxide, molybdenum oxide, copper oxide, etc. The upper electrodes 125 can be formed of the same or similar conductive material (e.g., TiN) as the lower electrodes 115.

Figure 8:
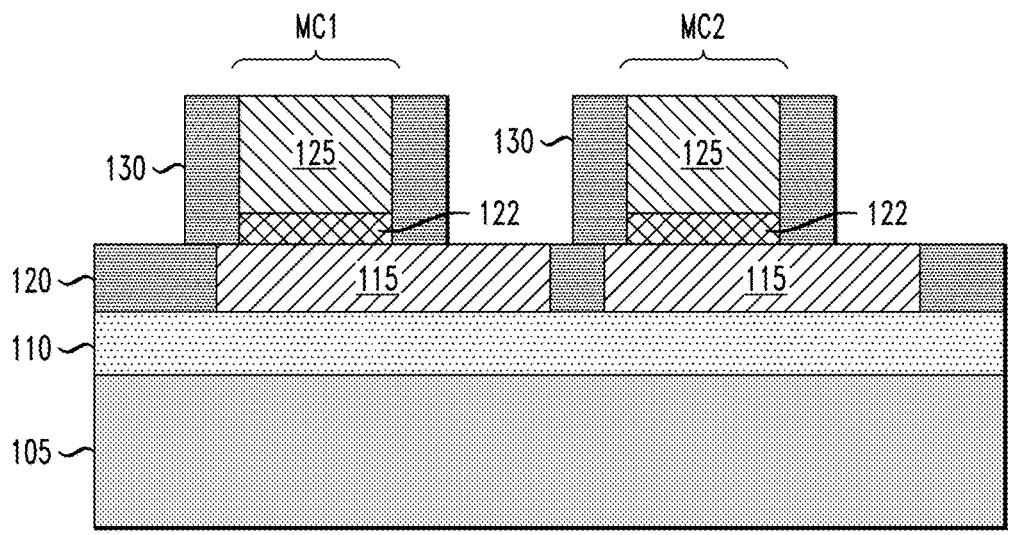

Next, FIG. 8 is a schematic cross-sectional side view of the semiconductor device shown in FIG. 7 after forming insulating spacers 130 on sidewalls on the stacked metal-oxide 122 and upper electrode 125 layers of the resistive memory cells MC1 and MC2. In one embodiment, the insulating spacers 130 are formed by depositing a conformal layer of insulating material over the structure shown in FIG. 7, e.g., a conformal layer of SiN. The conformal layer of insulating material is then patterned to form the insulating spacers 130, wherein the patterning process can be implement using an anisotropic dry etch process (e.g., ME) to etch away lateral portions of the conformal layer of insulating material, while leaving the insulating material on the sidewalls of the stack structures 122/125.

Figure 9:
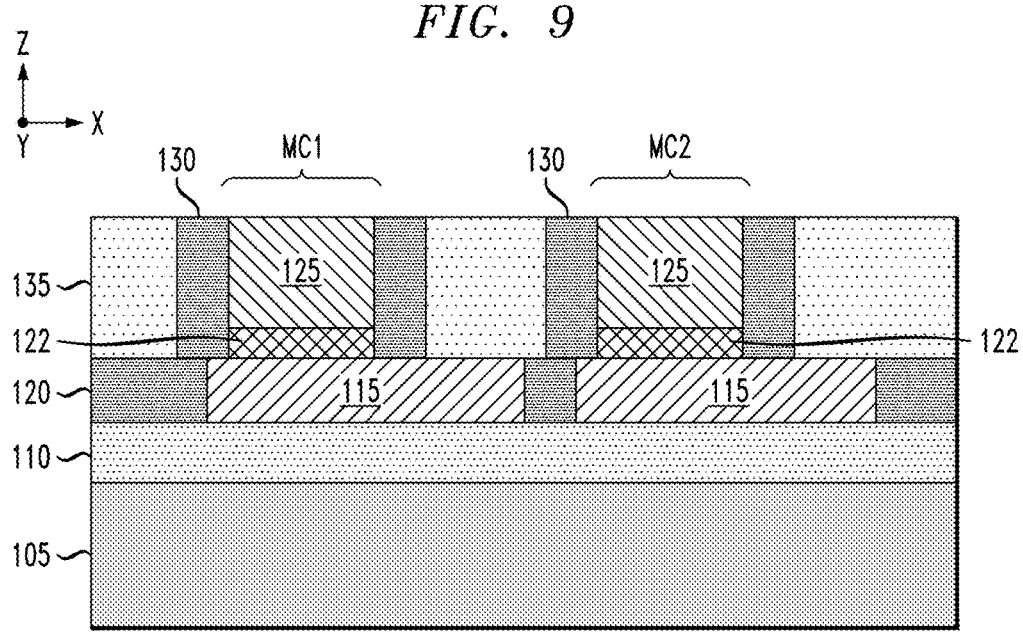

Next FIG. 9 is a schematic cross-sectional side view of the semiconductor device shown in FIG. 8 after forming a first ILD layer 135 to encapsulate the resistive memory cells MC1 and MC2 in dielectric material. In one embodiment, the first ILD layer 135 is formed by blanket depositing a layer of dielectric material over the structure shown in FIG. 8, followed by a CMP process to planarize the surface of the semiconductor structure down to an upper surface of the upper electrodes 125. The first ILD layer 135 can be formed of a dielectric material such as, silicon oxide (e.g. SiO2), silicon based low-k dielectrics, ULK (ultra-low-k) dielectric materials, etc.

Figure 10:
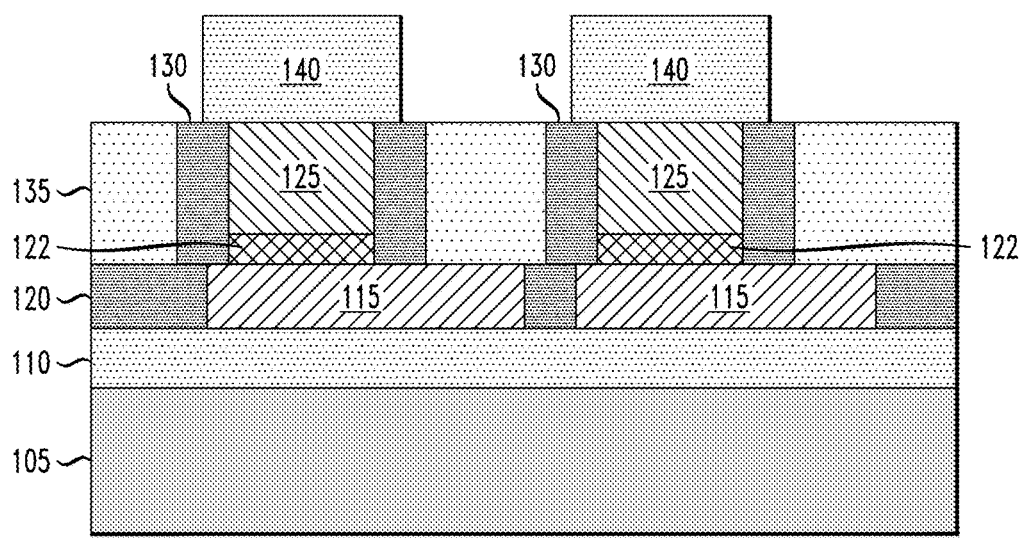

Following formation of the first ILD layer 135 as shown in FIG. 9, a metallization process is performed to form upper conductive lines 140 in contact with the upper electrodes 125 of the resistive memory cells MC1 and MC2, as schematically illustrated in FIG. 10. The upper conductive lines 140 of the RRAM crossbar array structure can be formed by depositing and patterning a layer of metallic material using known deposition and patterning methods. The upper conductive lines 140 can be formed of the same or similar metallic material as the lower conductive lines 110. The upper conductive lines 140 are preferably formed of a metallic material with low-resistivity to minimize voltage drop across along relatively long conductive lines of a large RRAM crossbar array structure (e.g., 100×100 resistive memory cell array). It is to be noted that the upper conductive lines 140 of the RRAM crossbar array structure are arranged in parallel and laterally extend in the Y-direction, orthogonal to the lower conductive lines 110.

Figure 11:
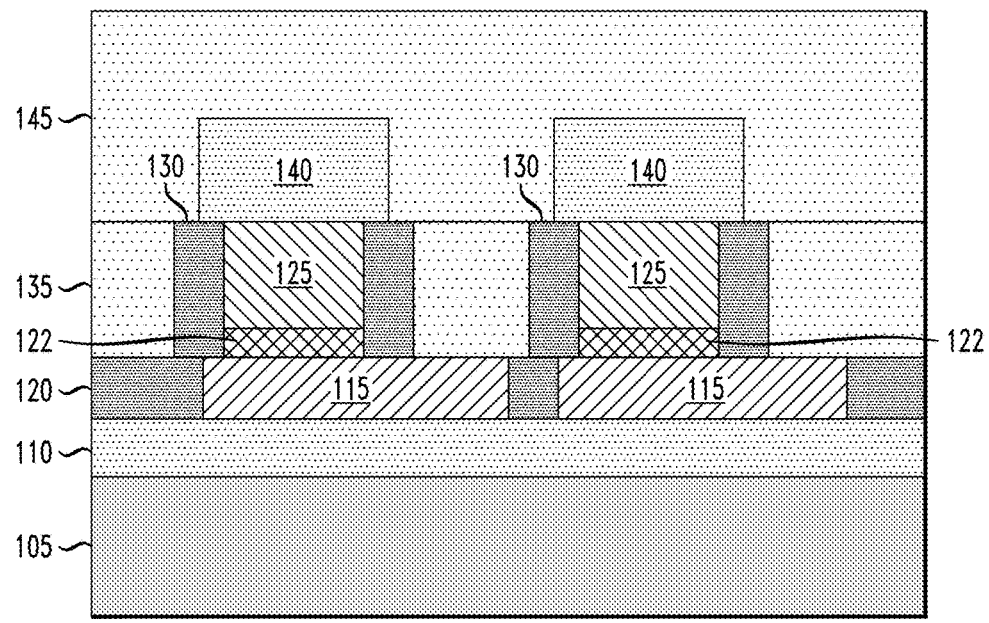
Figure 12A:
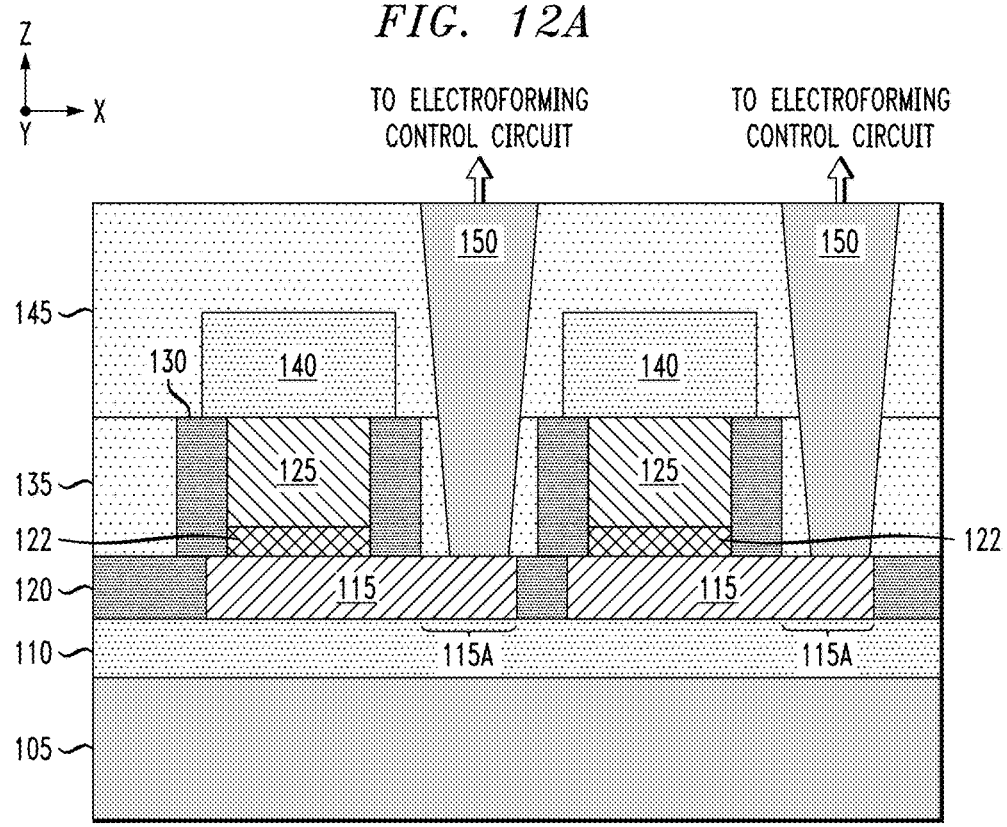
Figure 12B:
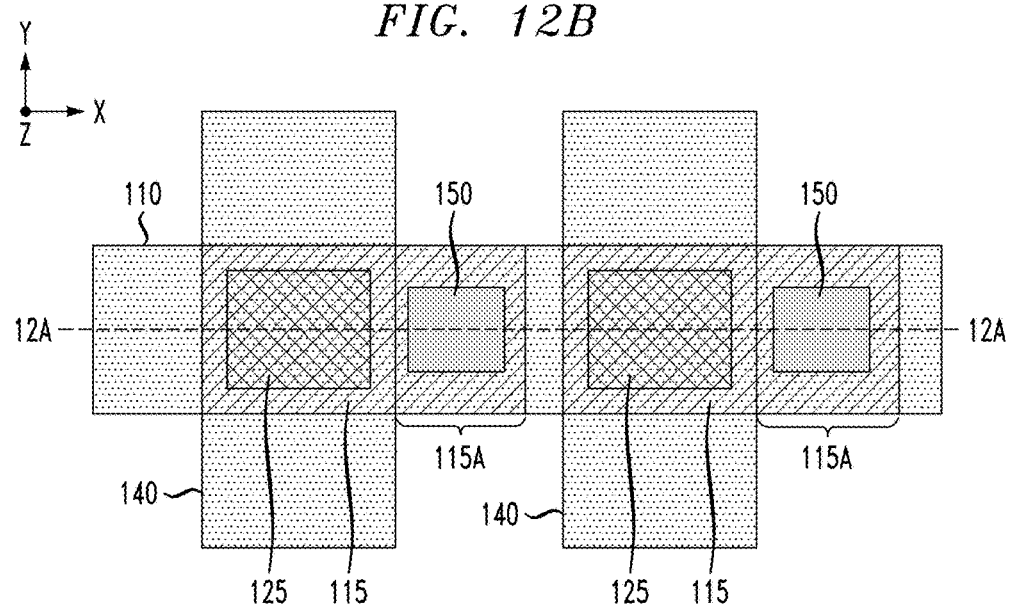

A next phase of the fabrication process comprises forming dedicated electroforming contacts to the lower electrodes of the resistive memory cells MC1 and MC2 using a process flow as schematically illustrated in FIGS. 11, 12A, and 12B. In particular, FIG. 11 is a schematic cross-sectional side view of the semiconductor device shown in FIG. 10 after forming a second ILD layer 145 to cover the upper conductive lines 140. The second ILD layer 145 can be formed of the same or similar material as the first ILD layer 135. The second ILD layer 145 is formed by blanket depositing a layer of dielectric material (e.g., SiO$_2$), followed by a CMP process to planarize the surface of the second ILD layer 145 to a target level, resulting in the semiconductor structure shown in FIG. 11.

Next, FIGS. 12A and 12B are schematic views of the semiconductor device shown in FIG. 11 after forming dedicated electroforming contacts 150 in the first and second ILD layers 135 and 145 in contact with extended portions 115A of the lower electrodes 115. FIG. 12A is a schematic cross-sectional side view of the semiconductor device shown in FIG. 11 after forming the dedicated electroforming contacts 150, and FIG. 12B is a top plan view of the semiconductor device shown in FIG. 12A. It is to be further noted that FIG. 12A is a cross-sectional view of the semiconductor structure of FIG. 12B along line 12A-12A shown in in FIG. 12B. The dedicated electroforming contacts 150 can be formed by patterning via openings through the first and second ILD layers 135 and 145 down to the extended portions 115A of the lower electrodes 115, using any suitable patterning technique (e.g., optical lithography patterning, e-beam lithography patterning, etc.). The via openings are then filled by depositing a layer of metallic material such as copper (Cu) or tungsten (W) to fill the via openings, followed by a CMP process to remove the overburden metallic material on the upper surface of the second ILD layer 145. Depending on the type of metallic material used to form the dedicated electroforming contacts 150, one or more liner layers (e.g., diffusion barrier, seed layer, etc.) can be deposited to line the via openings in through the first and second ILD layers 135 and 145 prior to the metal fill.

It is to be noted that in one embodiment, the first and second ILD layers 135 and 145 (or PMD layers) are formed of an insulating material (e.g., silicon oxide) that has high etch selectivity with respect to the insulating material (SiN) used to form the insulating spacers 130. In this regard, the via openings for the dedicated electroforming contacts 150 can be formed in a "self-aligned manner" such that the insulating spacers 130 will not be etched during the ILD etch process in the event that there is a misalignment in the etch mask image, which results in portions of the insulating spacers 130 being exposed in the electroforming contact openings that are formed in the first and second ILD layers 135 and 145 down to the extended portions 115A of the lower electrodes 115.

For ease of illustration, the drawings only show two adjacent resistive memory cells MC1 and MC2 disposed on one lower conductive line 110 of an RRAM crossbar array structure. However, the RRAM crossbar array structure could comprise thousands of resistive memory cells, with one restive memory cell disposed between each cross point of the lower and upper conductive lines 110 and 140. Each resistive memory cell would have a lower electrode 115 with an extended portion 115A extending out from the cross-point, and an upper electrode 125 having a footprint (area) which is less than the cross-point area, wherein the lower and top electrodes 115 and 125 are encapsulated in dielectric material (e.g., isolation layer 120 and sidewall spacers 130) to electrically isolate the lower and upper electrodes.

Each resistive memory cell in the RRAM crossbar array structure would have a dedicated electroforming contact 150 to the extended portion 115A of the lower electrode 115, which is used for electroforming the resistive memory cell. Each dedicated electroforming contact 150 would be connected to an electroforming control circuit formed in the FEOL layer of the semiconductor device through a network of electrical wiring and via contacts formed in the BEOL and MOL layers. Each dedicated electroforming contact 150 would be connected to a respective current limiting device (e.g., series resistance (e.g., polyresistor) or selector device (e.g., diode, FET, etc.)) in the electroforming control circuit, which limits an amount of current applied to the resistive memory cell during electroforming of the resistive memory cell. In one embodiment, an electroforming process is performed for a given resistive memory cell by supplying a current-controlled signal to the corresponding dedicated electroforming contact 150 while grounding the upper conductive line 140 and placing the lower conductive live 110 in an electrical floating state. The electroforming is performed by biasing one dedicated electroforming contact 150 and grounding one lower conductive line 140 at a time to sequentially form individual RRAM cells.

Figure 13:
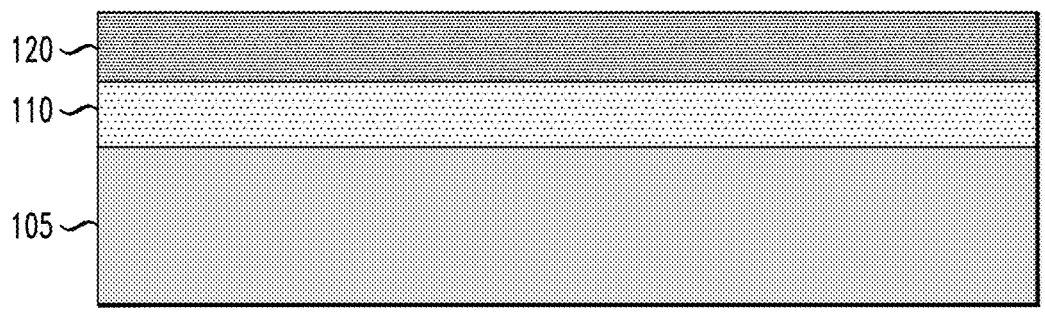
Figure 14:
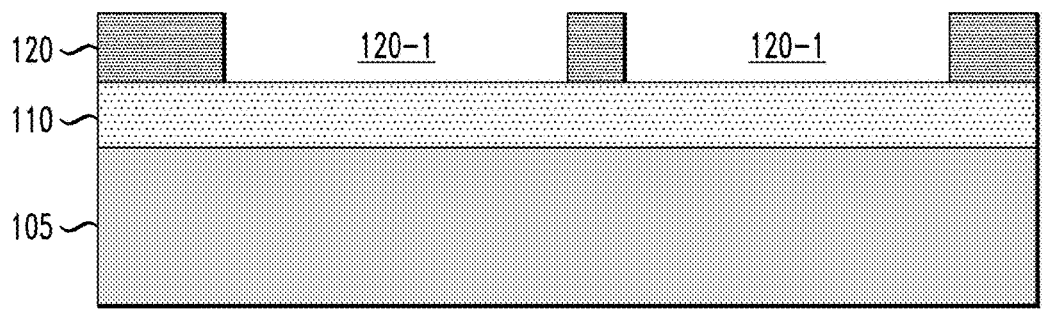

FIGS. 13 and 14 schematically illustrate an exemplary process flow for fabricating an array of resistive memory cells according to another embodiment of the invention. In particular, FIGS. 13 and 14 schematically illustrate an alternative embodiment for fabricating the lower electrodes 115 of the resistive memory cells as shown in FIG. 6. In particular, FIG. 13 is a schematic cross-sectional side view of the semiconductor device shown in FIG. 4 after forming the isolation layer 120 on the lower conductive lines 110. In this embodiment, the isolation layer 120 is formed by depositing a layer of insulating material (SiN) over the surface of the semiconductor structure to cover the lower conductive lines 110, followed by a CMP process to planarize the layer of insulating material down to a target thickness, resulting in the structure shown in FIG. 13.

FIG. 14 is a schematic cross-sectional side view of the semiconductor device shown in FIG. 13 after patterning the isolation layer 120 to form openings 120-1 that expose portions of the lower conductive line 110 (and other lower conductive lines of the RRAM crossbar array). The openings 120-1 comprise images of the lower electrodes 115 of the resistive memory cells. The lower electrodes 115 are then formed by depositing a layer of conductive material (e.g., TiN) to fill the openings 120-1 in the isolation layer 120, followed by a CMP process to remove the overburden portion the conductive material on the surface of the isolation layer 120. The CMP process results in the formation of the intermediate structure shown in FIG. 6. Thereafter, the fabrication process may continue with the process flow as schematically shown in FIGS. 7-12B, and as described above.

Figure 15:
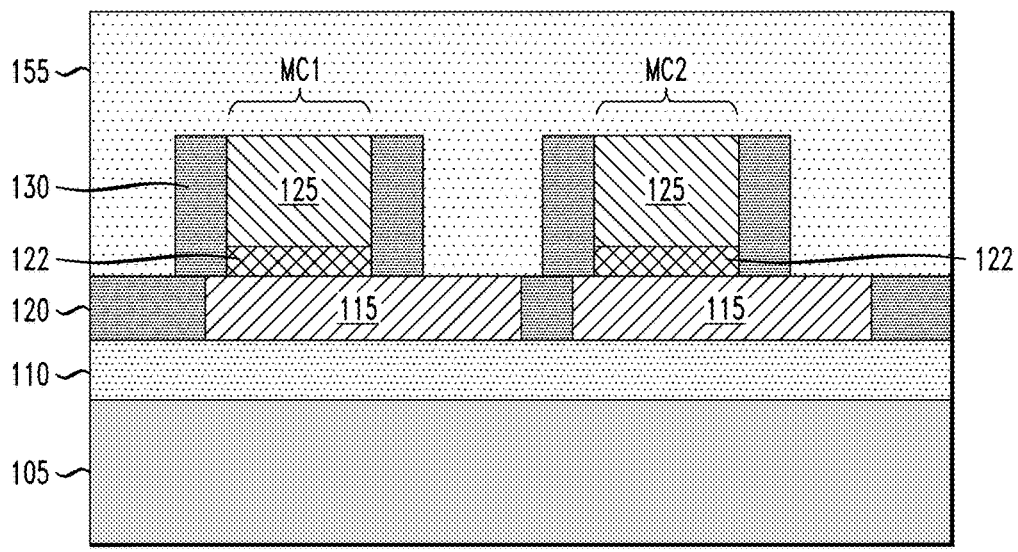
Figure 16:
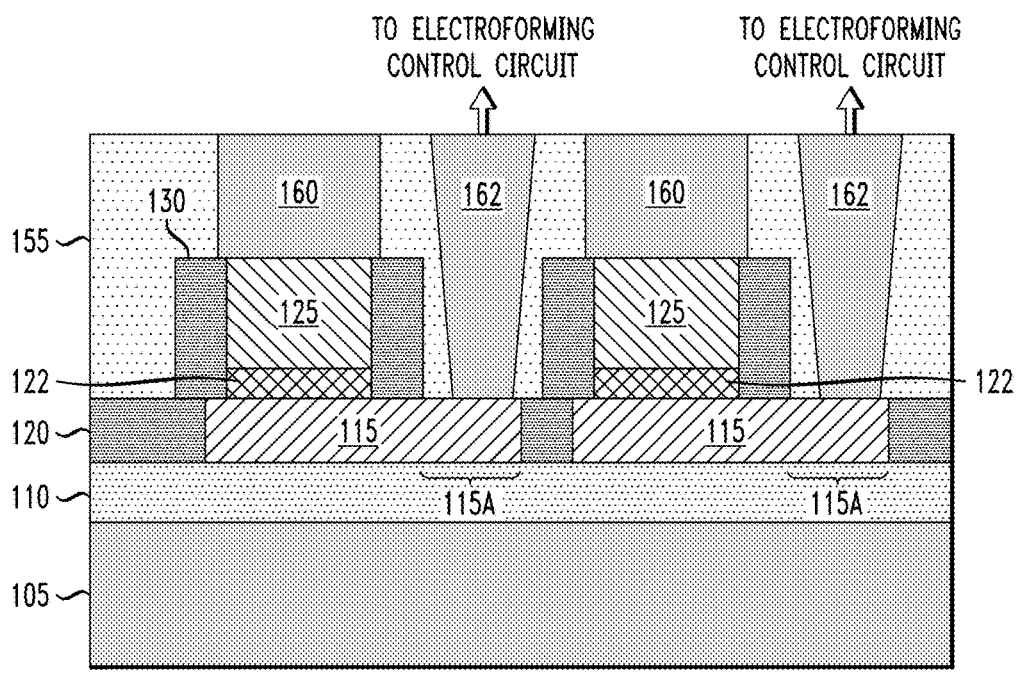

FIGS. 15 and 16 schematically illustrate an exemplary process flow for fabricating an array of resistive memory cells according to another embodiment of the invention. FIGS. 15 and 16 schematically illustrate an alternate embodiment for concurrently fabricating the upper conductive lines and the dedicated electroforming contacts to the lower electrodes of the resistive memory cells. In particular, FIG. 15 is a schematic cross-sectional side view of the semiconductor device shown in FIG. 8 after forming an ILD layer 155 over the surface of the semiconductor structure to cover the resistive memory cells MC1 and MC2. In one embodiment, the ILD layer 155 is formed by blanket depositing a layer of dielectric material, such as, silicon oxide (e.g., SiO2), silicon based low-k dielectrics, ULK dielectric materials, etc., followed by a CMP process to planarize the surface of the ILD layer 155 down to a target level.

Next, FIG. 16 is a schematic cross-sectional side view of the semiconductor device shown in FIG. 15 after forming upper conductive lines 160 and dedicated electroforming contacts 162 in the ILD layer 155. The upper conductive lines 160 are formed in contact with the upper electrodes 125 of the resistive memory cells, and the dedicated electroforming contacts 162 are formed in contact with the extended portions 115A of the lower electrodes 115 of the resistive memory cells. The embodiment of FIGS. 15 and 16 allows the upper conductive lines 160 and the dedicated electroforming contacts 162 to be concurrently formed using the same ILD patterning process and metal deposition process.

In particular, the ILD layer 155 is patterned to concurrently form trench openings (which define images of the upper conductive lines 160) down to the upper electrodes 125 of the resistive memory cells, as well as via contact openings (which define images of the dedicated electroforming contacts 162) down to the extended portions 115A of the lower electrodes 115. The trench and via openings are then filled by depositing a layer of metallic material such as copper or tungsten to fill the openings, followed by a CMP process to remove the overburden metallic material on the upper surface of the ILD layer 155, resulting in the structure shown in FIG. 16. Depending on the type of metallic material used to form the upper conductive lines 160 and the dedicated electroforming contacts 162, one or more liner layers (e.g., diffusion barrier layer, seed layer, etc.) can be deposited to line the etched openings in ILD layer 155 prior to the metal fill.

It is to be understood that the methods discussed herein can be incorporated in various semiconductor process flows to fabricate RRAM crossbar array structures (or other memory arrays which comprise resistive memory cells that require electroforming), in conjunction with integrated circuits having analog and digital circuitry or mixed-signal circuitry. In particular, integrated circuit dies can be fabricated with various devices such as FinFET devices, bipolar transistors, metal-oxide-semiconductor transistors, diodes, capacitors, inductors, etc. An integrated circuit can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques described herein according to embodiments of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a memory device, comprising:
    forming a lower conductive line on an interlayer dielectric layer;
    forming a lower electrode on the lower conductive line;
    forming an isolation layer to isolate the lower electrode, wherein an upper surface of the isolation layer is coplanar with an upper surface of the lower electrode;
    forming a stack structure on the lower electrode, wherein the stack structure comprises a metal-oxide layer disposed on the lower electrode, and an upper electrode disposed on the metal-oxide layer;
    forming insulating spacers on sidewalls of the stack structure;
    wherein the lower electrode, the metal-oxide layer, and the upper electrode comprise a resistive memory cell, and wherein the lower electrode has a footprint which is greater than a footprint of the upper electrode;
    forming an upper conductive line in contact with the upper electrode, wherein the upper conductive line is arranged orthogonal to the lower conductive line; and
    forming a dedicated electroforming contact in contact with an extended portion of the lower electrode which extends past a cross-point of the upper and lower conductive lines.

2. The method of claim 1, further comprising forming electroforming circuitry connected to the dedicated electroforming contact to enable electroforming of the resistive memory cell by applying electroforming signals to the resistive memory cell through the dedicated electroforming contact.

3. The method of claim 1, wherein the memory device comprises a resistive random-access memory (RRAM) crossbar array.

4. The method of claim 3, wherein the RRAM crossbar array comprises a two-dimensional memory array comprising at least 100×100 resistive memory cells.

5. The method of claim 1, wherein forming the lower electrode on the lower conductive line comprises:
    depositing a layer of conductive material over the lower conductive line; and
    patterning the layer of conductive material to form the lower electrode.

6. The method of claim 5, wherein forming the isolation layer comprises:
    depositing a layer of dielectric material; and
    planarizing the layer of dielectric material down to the upper surface of the lower electrode, wherein the planarized layer of dielectric material comprises the isolation layer.

7. The method of claim 1, wherein forming the lower electrode on the lower conductive line, and forming the isolation layer comprises:
   depositing and planarizing a layer of dielectric material over the lower conductive line, wherein the planarized layer of dielectric material comprises the isolation layer;
   patterning the isolation layer to form an opening in the isolation layer which exposes a portion of the lower conductive line; and
   depositing a layer of conductive material to fill the opening; and
   removing an overburden portion of the layer of conductive material from the upper surface of the isolation layer;
   wherein a remaining portion of the layer of conductive material in the opening comprises the lower electrode.

8. The method of claim 1, wherein forming the stack structure on the lower electrode comprises:
   depositing a layer of metal-oxide material;
   depositing a layer of conductive material over the layer of metal-oxide material; and
   concurrently patterning the layer of conductive material and the layer of metal-oxide material to form the stack structure comprising the metal-oxide layer and the upper electrode of the resistive memory cell.

9. The method of claim 1, wherein forming the upper conductive line in contact with the upper electrode comprises:
   depositing a first dielectric layer over the resistive memory cell;
   planarizing the first dielectric layer to expose an upper surface of the upper electrode of the resistive memory cell; and
   depositing a layer of conductive material on a planarized surface of the first dielectric layer; and
   patterning the layer of conductive material to form the upper conductive line, which is in contact with the exposed upper surface of the upper electrode of the resistive memory cell.

10. The method of claim 9, further comprising:
    depositing a second dielectric layer over the first dielectric layer and the upper conductive line;
    planarizing the second dielectric layer;
    forming a contact opening in the first and second dielectric layers to expose at least a portion of the extended portion of the lower electrode which extends past a cross-point of the upper and lower conductive lines; and
    filling the contact opening with a conductive material to form the dedicated electroforming contact.

11. The method of claim 1, wherein forming the upper conductive line and forming the dedicated electroforming contact, comprises:
    depositing a dielectric layer over the resistive memory cell;
    planarizing the dielectric layer;
    patterning the planarized dielectric layer to form a trench opening and a via opening, wherein the trench opening exposes an upper surface of the upper electrode of the resistive memory cell, and wherein the via opening exposes at least a portion of the extended portion of the lower electrode of the resistive memory cell; and
    depositing a layer of conductive material to fill the trench and via openings with conductive material to form the upper conductive line and the dedicated electroforming contact.

12. The method of claim 1, wherein the lower and upper electrodes of the resistive memory cell are formed of a metal nitride.

13. The method of claim 1, wherein the lower and upper conductive lines are formed of one of copper, tungsten and aluminum.

14. The method of claim 1, wherein the metal-oxide layer of the resistive memory cell is formed of one of hafnium oxide, tantalum oxide, nickel oxide, titanium oxide, zirconium oxide, zinc oxide, tungsten oxide, aluminum oxide, molybdenum oxide, and copper oxide.

* * * * *